US011444110B2

(12) United States Patent
Rodrigues Goncalves et al.

(10) Patent No.: US 11,444,110 B2
(45) Date of Patent: Sep. 13, 2022

(54) PIXEL COMPRISING A CHARGE STORAGE ZONE

(71) Applicant: STMicroelectronics (Crolles 2) SAS, Crolles (FR)

(72) Inventors: Boris Rodrigues Goncalves, Theys (FR); Frederic Lalanne, Bernin (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 17/225,329

(22) Filed: Apr. 8, 2021

(65) Prior Publication Data

US 2021/0343766 A1 Nov. 4, 2021

(30) Foreign Application Priority Data

Apr. 30, 2020 (FR) ........................................ 2004324

(51) Int. Cl.
*H01L 27/146* (2006.01)
*H04N 5/369* (2011.01)
*H04N 5/378* (2011.01)

(52) U.S. Cl.
CPC .. *H01L 27/14614* (2013.01); *H01L 27/14607* (2013.01); *H01L 27/14616* (2013.01); *H01L 27/14643* (2013.01); *H04N 5/3696* (2013.01); *H04N 5/378* (2013.01)

(58) Field of Classification Search
CPC ......... H01L 27/14614; H01L 27/14607; H01L 27/14616
See application file for complete search history.

(56) References Cited

U.S. PATENT DOCUMENTS

2011/0187911 A1* 8/2011 Shinohara ......... H01L 27/14614
257/E27.15
2017/0125474 A1* 5/2017 Roy .................. H01L 27/14607
2018/0302582 A1 10/2018 Roy

FOREIGN PATENT DOCUMENTS

JP 2011066241 A * 3/2011

OTHER PUBLICATIONS

INPI Search Report and Written Opinion for FR 2004324 dated Jan. 12, 2021 (8 pages).

* cited by examiner

*Primary Examiner* — Thanh Luu
(74) *Attorney, Agent, or Firm* — Crowe & Dunlevy (57) ABSTRACT

A pixel includes a photoconversion zone, an insulated vertical electrode and at least one charge storage zone. The photoconversion zone belongs to a first part of a semiconductor substrate and each charge storage zone belongs to a second part of the substrate physically separated from the first part of the substrate by the insulated vertical electrode.

26 Claims, 6 Drawing Sheets

PIXEL COMPRISING A CHARGE STORAGE ZONE

PRIORITY CLAIM

This application claims the priority benefit of French Application for Patent No. 2004324, filed on Apr. 30, 2020, the content of which is hereby incorporated by reference in its entirety to the maximum extent allowable by law.

TECHNICAL FIELD

The present disclosure relates generally to electronic devices or circuits. The present disclosure more particularly relates to a sensor pixel and, in particular, to a distance sensor working on the principle of measuring time of flight, or TOF sensor, and a method for controlling such a pixel.

BACKGROUND

In a TOF sensor, a light source emits light toward a scene. A time of flight detection pixel, or TOF pixel, of the sensor receives the light returned by a point of the scene associated with this pixel. The measurement of the time of flight, that is to say the time taken by the light to travel from the light source to the point of the scene with which the pixel is associated, and from this point to the pixel, makes it possible to calculate the distance separating the pixel from this point.

In the case where one wishes to obtain a relief image of a scene, the TOF sensor comprises a matrix of TOF pixels to measure the distance separating each pixel from the point of the scene with which this pixel is associated. This makes it possible to obtain a map of distances separating the sensor from the different points of the scene with which the pixels are associated, and a relief image of the scene can then be reconstructed from this map of the distances.

A pixel of a TOF sensor comprises charge storage zones in which charges that have been photogenerated in a photosensitive zone, or photoconversion zone, of the pixel are next temporarily stored before being read.

The measurement precision of the distance between a pixel of a TOF sensor and a point of the scene with which this pixel is associated depends at least in part on the transfers of the photogenerated charges from the photoconversion zone of the pixel to the temporary charge storage zones.

Other pixels comprise charge storage zones, for example the pixels of an image sensor of the global shutter type. In a pixel of a sensor of the global shutter type, the quality of the image obtained with the sensor also depends at least in part on the transfers of the photogenerated charges from the photoconversion zone of the pixel to a temporary charge storage zone.

There is a need in the art to address at least some of the known problems with pixels comprising at least one charge storage zone, in particular known pixels belonging to a TOF sensor or to a global shutter image sensor.

SUMMARY

One embodiment addresses all or some of the drawbacks of the known pixels comprising at least one charge storage zone, in particular known pixels of a TOF sensor or of a global shutter image sensor.

One embodiment provides a pixel comprising a photoconversion zone, an insulated vertical electrode and at least one charge storage zone, the photoconversion zone belonging to a first part of a semiconductor substrate and each charge storage zone belonging to a second part of the substrate physically separated from the first part of the substrate by the electrode.

According to one embodiment, the electrode passes through the substrate from a first face of the substrate, the pixel further comprising, for each charge storage zone: a first doped zone in contact with said charge storage zone; a second doped zone; a gate resting on the first face between the photoconversion zone and said second zone; and an electrical connection between the first zone and the second zone, the electrode being configured, for each storage zone, to electrically and optically insulate the first part of the substrate comprising the photoconversion zone and the second zone from the second part of the substrate comprising the charge storage zone and the first zone.

According to one embodiment, for each charge storage zone, said connection is arranged outside the substrate, above the first face.

According to one embodiment, each charge storage zone is delimited laterally, widthwise, by two portions of the electrode that are parallel and facing one another, the first zone in contact with the charge storage zone being arranged at one end of the charge storage zone taken lengthwise.

According to one embodiment: the substrate is doped with a first type of conductivity; the photoconversion zone comprises a layer doped with a second type of conductivity and arranged in the substrate on the first side of the face; for each charge storage zone, the first and second zones are arranged in the substrate on the side of the first face, and are doped with the second type of conductivity; and each charge storage zone comprises a box doped with the second type of conductivity arranged in the substrate on the side of the first face.

According to one embodiment, for each charge storage zone: the first and second zones have a same doping level; and/or the first and second zones have a same doping level as the layer of the photoconversion zone; and/or the box of the charge storage zone is more heavily doped than the first zone.

According to one embodiment, for each charge storage zone, said gate rests on a channel region extending from the second zone to the layer of the photoconversion zone, the channel region being less heavily doped with the second type of conductivity than the layer of the photoconversion zone and the second zone.

According to one embodiment, for each charge storage zone, the channel region comprises a first portion and a second portion less heavily doped than the first portion, the second portion extending from the layer of the photoconversion zone to the first portion, and the first portion extending from the second portion to the second zone.

According to one embodiment, for each charge storage zone, the second zone is separated from the layer of the photoconversion zone by the channel region and by a region of the substrate doped with the first type of conductivity.

According to one embodiment, for each charge storage zone, the pixel comprises: a doped reading zone arranged in the substrate on the side of the first face in the second part of the substrate comprising the charge storage zone; and an additional gate resting on a portion of the substrate extending between the charge storage zone and the reading zone, preferably, the additional gate spreading to the charge storage zone.

According to one embodiment, at least two charge storage zones belong to a same second part of the substrate.

Another embodiment provides a sensor comprising a plurality of pixels as described.

According to one embodiment, two adjacent pixels share a same second part of the substrate or a same first part of the substrate.

According to one embodiment, the sensor comprises a circuit configured to apply a first polarization potential to the first part of the substrate of each pixel, and, for each charge storage zone of each pixel: to apply the first polarization potential to the second part of the substrate comprising the storage zone during each reading phase of the storage zone; and to apply a second polarization potential to the second part outside of reading phases of said storage zone, the first and second polarization potentials preferably being configured so that a potential well in the charge storage zone is deeper when the second polarization potential is applied to the second part of the substrate than when the first polarization potential is applied to the second part of the substrate.

Another embodiment provides a control method for a pixel as described comprising the polarization of the first part of the substrate with a first potential, and for each charge storage zone: polarizing, with the first potential, the second part of the substrate comprising the charge storage zone during each reading phase of the charge storage zone; and polarizing, with a second polarization potential, said second part outside of reading phases of said storage zone, charge storage zone is deeper when the second potential is applied to the second part of the substrate than when the first potential is applied to the second part of the substrate.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
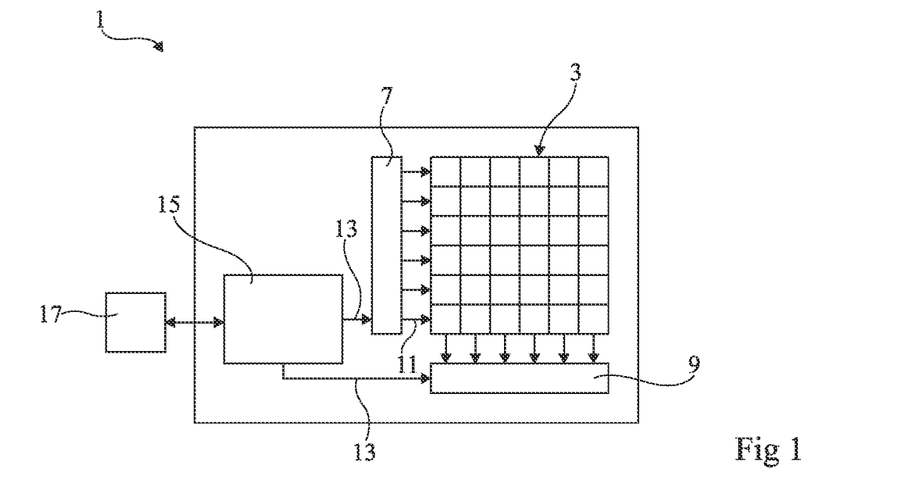
FIG. 1 is a top view schematically showing an exemplary TOF sensor.

FIG. 1 is a schematic top view of an exemplary TOF sensor. The sensor 1 comprises a matrix 3 of TOF pixels, for example a matrix of one thousand rows by one thousand columns. The matrix 3 is associated with a row decoder 7 and a column decoder 9. The row decoder 7 provides signals 11 making it possible to select one or the other of the rows of the matrix. The column decoder 9 makes it possible to read the pixels of a selected row. The row decoder 7 and the column decoder 9 are controlled by signals 13 provided by a control and processing circuit 15. The control and processing circuit 15, for example, comprises a processor associated with one or several memories.

In this example where the sensor 1 is a TOF sensor, the sensor 1 is further associated with a light source 17 in order to illuminate a scene whereof one wishes to obtain the image in relief. This light source 17 is, for example, a laser whose wavelength can be inclusively between 500 and 1000 nm. The light source 17 is connected to the control and processing circuit 15, in order to synchronize the control signals applied to the TOF pixels of the matrix 3 and to the light source 17.

As an example, the light source 17 emits a periodic signal $L_E$, for example sinusoidal, the frequency of which can be inclusively between 20 and 100 MHz, for example equal to 25 MHz. For each pixel, the phase φ is determined between the emitted light signal $L_E$ and a light signal $L_R$ received by this pixel. The distance separating the pixel from its associated point is next determined from this phase shift φ.

Figure 2:
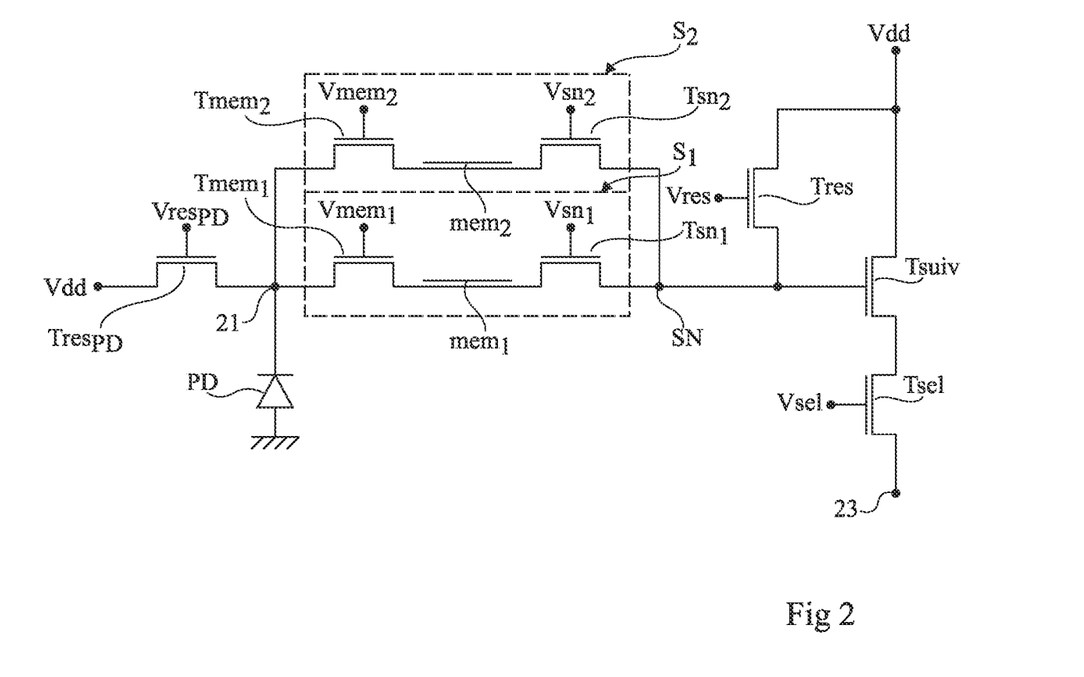
FIG. 2 shows an exemplary TOF pixel circuit.

FIG. 2 shows an example of a circuit of a TOF pixel, for example a TOF pixel of the sensor 1 of FIG. 1.

The TOF pixel comprises a photosensitive element, or photoconversion element, PD whereof one terminal is connected to a node 21 and the other terminal is connected to a node or rail for applying a reference potential, for example the ground. The node 21 is coupled to a reading node SN by means of several identical assemblies, in this case two assemblies $S_1$ and $S_2$, that are connected in parallel between the nodes 21 and SN. Each assembly $S_i$, with i an integer equal to 1 or 2 in this example, comprises a MOS transistor with transfer n-channel, $Tmem_i$, a charge storage zone $mem_i$ and a MOS transistor with reading n-channel, $Tsn_i$. The source of the transistor $Tmem_i$ is connected to the node 21, and the drain of the transistor $Tmem_i$ is connected to a terminal of the storage zone $mem_i$. The transistor $Tmem_i$ is controlled by a signal $Vmem_i$ applied on its gate. The source of the transistor $Tsn_i$ is connected to the other terminal of the storage zone $mem_i$, and the drain of the transistor $Tsn_i$ is connected to the reading node SN. The transistor $Tsn_i$ is controlled by a signal $Vsn_i$ applied on its gate. Embodiments of storage zones $mem_i$ will be given hereinafter.

The TOF pixel is associated with a reading device that can be shared by several pixels, for example four pixels. The reading device includes a precharge n-channel MOS transistor, Tres, an n-channel MOS transistor mounted as follower source, Tsuiv, and an n-channel selection MOS transistor, Tsel, connected as shown. The reading node SN is coupled by the transistor Tres to a node or rail for applying a supply potential Vdd, for example a potential greater than the reference potential. The transistor Tres is controlled by a signal Vres applied on its gate. The reading node SN is also coupled to the gate of the transistor Tsuiv whose drain is coupled to the supply rail, and whose source is coupled to the output rode or rail 23 of the circuit of the pixel by means of the transistor Tsel, the transistor Tsel being controlled by a signal Vsel applied on its gate.

In this example, the pixel TOF further comprises an n-channel MOS transistor, $Tres_{PD}$, for resetting the photosensitive element PD. The source of the transistor $Tres_{PD}$ is connected to the node 21 and the drain of the transistor $Tres_{PD}$ is connected to the supply rail Vdd. The transistor $Tres_{PD}$ is controlled by a signal $Vres_{PD}$ applied on its gate.

In order to determine the phase shift φ between the emitted light signal $L_E$ and the light signal $L_R$ received by the pixel, the signal $L_R$ is sampled by transferring, successively and at regular intervals, charges photogenerated in the photoconversion element PD toward the storage zones mem1, then mem2. The total duration to perform both of these two successive transfers is less than or equal to a period of the signals $L_E$ and $L_R$. Furthermore, the set of these two successive transfers is repeated a large number of times, for example at least 100,000 times. The charges accumulated in the storage zones are next read by transferring, to the node SN, the charges of the zone $mem_1$, then of the zone $mem_2$.

An operating mode of the TOF pixel of FIG. 2 will now be described in more detail in connection with FIG. 3.

Figure 3:
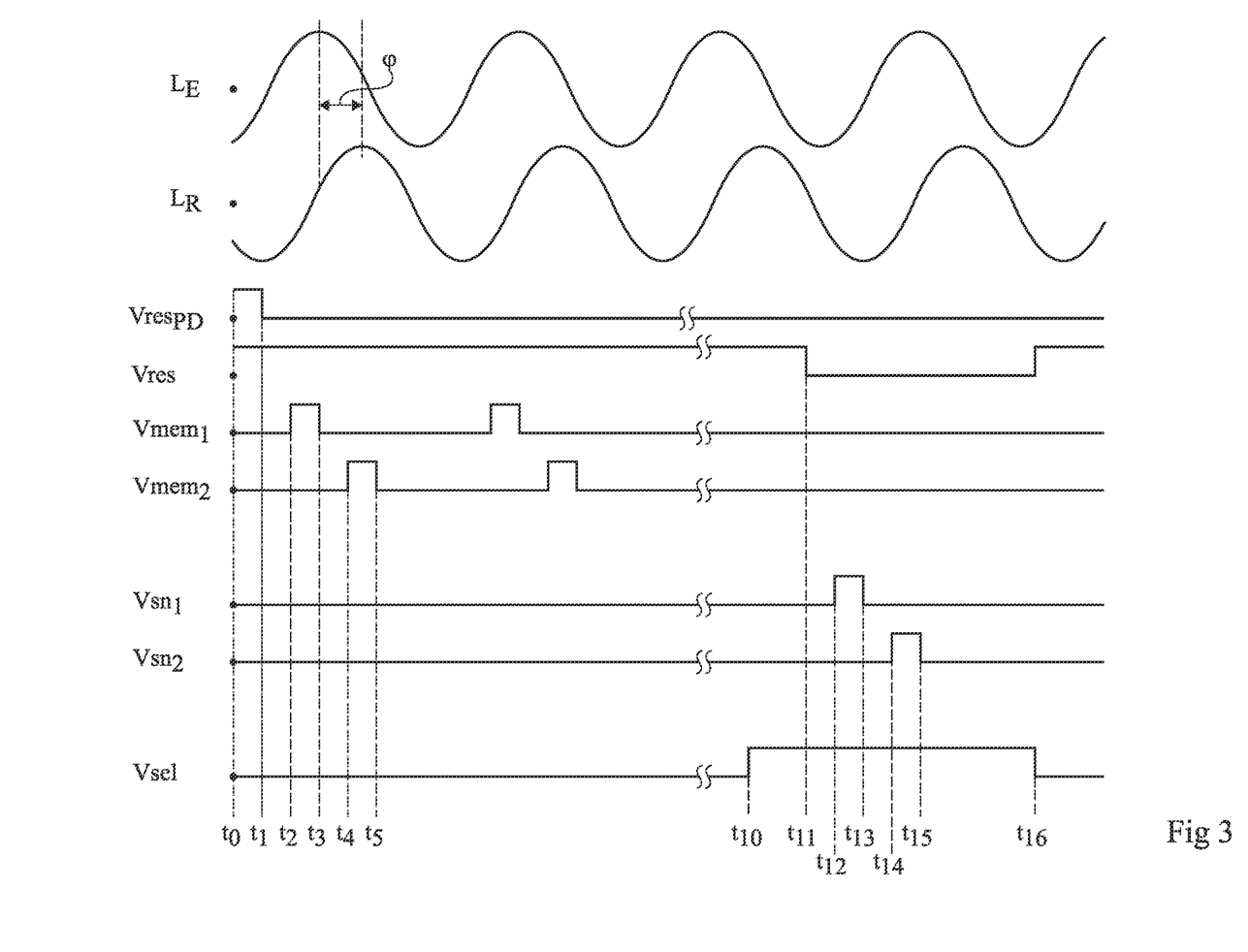
FIG. 3 is a timing diagram illustrating a control method of the TOF pixel of FIG. 2.

FIG. 3 is a timing diagram of the light signal $L_E$ emitted by the light source 17 associated with the sensor 1 (FIG. 1), of the light source $L_R$ received by the TOF pixel, and of the digital signals $Vres_{PD}$, Vres, $Vmem_i$, $Vsn_i$ and Vsel. By default, the signals $Vres_{PD}$, $Vmem_i$, $Vsn_i$, and Vsel are at a low level and the signal Vres is at a high level, the transistors $Tres_{PD}$, $Tmem_i$, $Tsn_i$ and Tsel then being in the off state and the transistor Tres being in the on state.

The photosensitive element PD is first reset, in this example by placing the transistor $Tres_{PD}$ in the on state (signal $Vres_{PD}$ in the high state) between instants $t_0$ and $t_1$. An integration cycle of the pixel then begins at instant $t_1$, and is synchronized with the signal $L_E$.

During the integration cycle, the photogenerated charges are transferred into the photosensitive zone PD toward the storage zones $mem_i$. To that end, the transfer transistors $Tmem_i$, are placed in the on state each in turn. More particularly, the transistor $Tmem_1$ is placed in the on state ($Vmem_1$ high) between instants $t_2$ and $t_3$, then the transistor $Tmem_2$ is placed in the on state ($Vmem_2$ high) between instants $t_4$ and $t_5$. As previously indicated, the set of these two transfers is next repeated a large number of times. Throughout the entire duration of the integration cycle, the signal Vres is in the high state, the transistor Tres is on, and the potential of the reading node SN is substantially equal to the potential Vdd.

At the end of the integration cycle, from an instant $t_{10}$, the charges stored in each of the storage zones $mem_i$ are read. To that end, the reading transistors $Tsn_i$ are placed in the on state each in turn, and the potential level on the node SN is measured and stored after each reading of the charges stored in a storage zone $mem_i$. More specifically, the transistor Tsel is placed in the on state (Vsel high) at instant $t_{10}$, and the precharge transistor Tres is placed in the off state (Vres low) at instant $t_{11}$. The transistor $Tsn_1$ is next placed in the on state ($Vsn_1$ high) between successive instants $t_{12}$ and $t_{13}$, then the transistor $Tsn_2$ is placed in the on state ($Vsn_2$ high) between successive instants $t_{14}$ and $t_{15}$. First and second potential levels of the node SN are measured and stored, respectively between instants $t_{13}$ and $t_{14}$, and between instant $t_{15}$ and a following instant $t_{16}$. At instant $t_{16}$, the signal Vsel is returned to the low state and the signal Vres is returned to the high state. A new integration cycle can then begin.

In this operating mode, the first and second measured potential levels are representative of the charges stored, respectively, in the storage zone $mem_1$, and in the storage zones $mem_1$ and $mem_2$. In one variant embodiment, a reset of the reading node SN is provided, by applying a pulse with a high potential on the transistor Tres, after each reading of the charges accumulated in a storage zone $mem_i$. In this case, the first and second potential levels are representative of the charges stored in a single storage zone, respectively $mem_1$ and $mem_2$.

These two potential levels make it possible to determine the phase shift φ between the light signals $L_E$ and $L_R$, and therefore to deduce therefrom the distance separating the pixel from the point of the scene with which the pixel is associated.

Although an embodiment and control have been described of a TOF pixel comprising two identical assemblies $S_i$, the phase shift φ between the signals $L_E$ and $L_R$ can also be determined by using a TOF pixel comprising more than two assemblies $S_i$, for example three or four assemblies $S_i$.

As an example, the duration of a transfer to a storage zone $mem_i$ is inclusively between 5 and 30 ns. The duration separating two transfers to a same storage zone $mem_i$ is for example 40 ns when the frequency of the signals $L_E$ and $L_R$ is 25 MHz. In this case, the duration of an integration cycle can be about 10 ms when the charge transfers toward each of the storage zones $mem_i$ are done 250,000 times each. The duration of the charge transfer from a storage zone $mem_i$ toward the reading node SN is for example inclusively between 1 and 10 µs.

In a pixel, when photogenerated charges in the photoconversion element PD are transferred in an unwanted manner toward a charge storage zone $mem_i$, that is to say these charges are transferred while the corresponding transistor $Tmem_i$ is in the off state, this causes an error on the measurement of the distance between the pixel and a point of the scene associated with this pixel. Furthermore, if a ray of light reaching the photoconversion element PD next reaches a charge storage zone $mem_i$ and generates a charge there by photoconversion, this also causes an error on the measurement of the distance between the pixel and a point of the scene associated with this pixel.

Similarly, in a pixel of a global shutter sensor, an unwanted transfer of photogenerated charges of the photoconversion element PD from the pixel toward a charge storage zone $mem_i$ of the pixel, and/or a generation of charges, by photoconversion, directly in a charge storage zone mem$_i$ of the pixel cause a decrease in the quality of the image obtained with the sensor.

To avoid the phenomena described above, the inventors propose a pixel comprising one or several charge storage zones in which each charge storage zone is optically and electrically insulated from the photoconversion element of the pixel when no transfer is in progress between the photoconversion element and this charge storage zone. More particularly, here the inventors propose a pixel in which the photoconversion zone of the pixel is formed in a first part of a semiconductor substrate, and each charge storage zone of the pixel is formed in a second part of the substrate that is physically separated from the first part of the substrate by an insulated vertical electrode.

One embodiment of such a pixel will now be described in relation with FIGS. 4, 5, 6 and 7.

Figure 4:
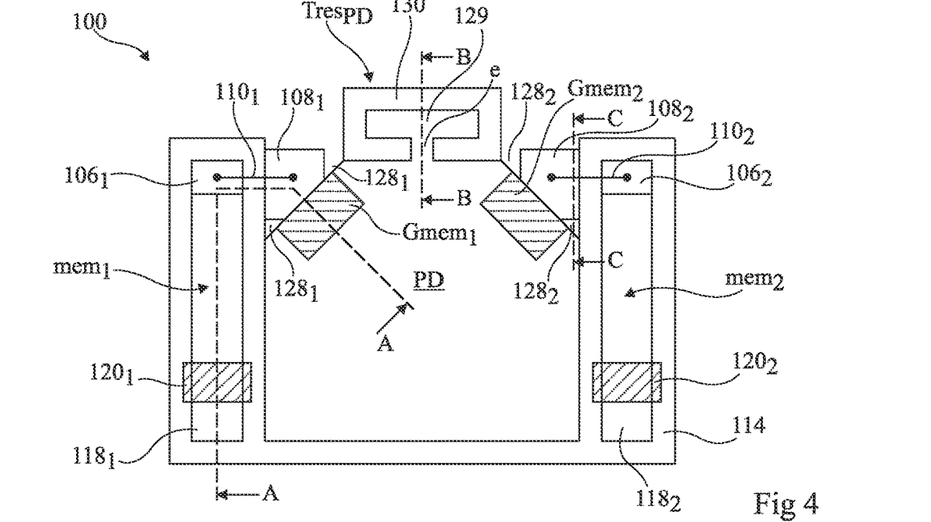
FIG. 4 shows, in schematic top view, an embodiment of a pixel of the type shown in FIG. 2.

FIGS. 4, 5, 6 and 7 schematically show one embodiment of a pixel 100 comprising at least one storage zone mem$_i$. In this example, the pixel 100 is a TOF pixel corresponding to the pixel 1 described in relation with FIG. 2, the pixel 100 comprising two storage zones mem$_1$ and mem$_2$. FIG. 4 is a top view of the pixel 100, FIGS. 5, 6 and 7 being sectional views respectively along the broken line AA of FIG. 4, the plane BB of FIG. 4 and the plane CC of FIG. 4.

The pixel 100 comprises a semiconductor substrate 102, for example made from silicon. The substrate is doped with a first type of conductivity, in this example type p. Preferably, the doping level of the substrate 102 decreases approaching a face 104 of the substrate 102, the upper face in FIGS. 5, 6 and 7.

The pixel 100 further comprises a photosensitive zone, or photoconversion zone, PD. The zone PD is arranged in the substrate 102. The zone PD is arranged on the side of the face 104 of the substrate. In other words, the zone PD penetrates the substrate 102 from its face 104.

The zone PD is configured so that, when it receives light, charges are generated in the zone PD, by photoconversion of a photon into an electron-hole pair, and so that the photogenerated electrons or the photogenerated holes, in this example electrons, accumulate in the zone PD until they are transferred toward the storage zone mem$_1$ or mem$_2$. The photogenerated charges (electrons or holes) that are not intended to be transferred toward the zone mem$_1$ or mem$_2$, in this example the photogenerated holes, are discharged toward a polarization potential applied to the substrate 102.

For each charge storage zone mem$_i$, the pixel 100 comprises a doped zone 106$_i$ in contact with this zone mem$_i$, this zone 106$_i$ being said to be associated with the zone mem$_i$. Each zone 106$_i$ is arranged in the substrate 102, on the side of its face 104. In other words, each zone 106$_i$ penetrates the substrate 102, from its face 104.

In this example, the pixel 100 therefore comprises a zone 106$_1$ in contact with the charge storage zone mem$_1$ and a zone 106$_2$ in contact with the charge storage zone mem$_2$.

For each charge storage zone mem$_i$, the pixel 100 further comprises a doped zone 108$_i$ and a gate Gmem$_i$, the doped zone 108$_i$ and the gate Gmem$_i$ being said to be associated with this zone mem$_i$.

Each zone 108$_i$ is arranged in the substrate 102, on the side of its face 104. In other words, each zone 108$_i$ penetrates the substrate 102, from its face 104. The zones 108$_i$ are doped with the same type of conductivity as the zones 106$_i$, and, more particularly, with the opposite type of conductivity from that of the substrate 102, the zones 106$_i$ and 108$_i$ therefore being doped with type n in this example. Furthermore, preferably, each zone 108$_i$ has the same level of doping as the corresponding zone 106$_i$.

Each gate Gmem$_i$ rests on the face 104 of the substrate 102, between the zone PD and the zone mem$_i$ with which the gate Gmem$_i$ is associated. In other words, the substrate 102 comprises a region 126$_i$ (see the region 126$_1$ in FIG. 5) extending from the zone mem$_i$ to the zone PD, which is covered, preferably completely, by the gate Gmem$_i$.

The gate Gmem$_i$ corresponds to the gate of the transistor Tmem$_i$, the drain and the source of this transistor Tmem$_i$ respectively being formed by the zone 108$_i$ and by the zone PD, and the channel region of this transistor Tmem$_i$ being formed by the region 126$_i$.

In this example of a pixel 100 with two zones mem$_1$ and mem$_2$, the pixel 100 therefore comprises a zone 108$_1$ and a gate Gmem$_1$ resting on the face 104 of the substrate 102, between the zone PD and the zone mem$_1$, as well as a zone 108$_2$ and a gate Gmem$_2$ resting on the face 104 of the substrate 102, between the zone PD and the zone mem$_2$.

Figure 5:
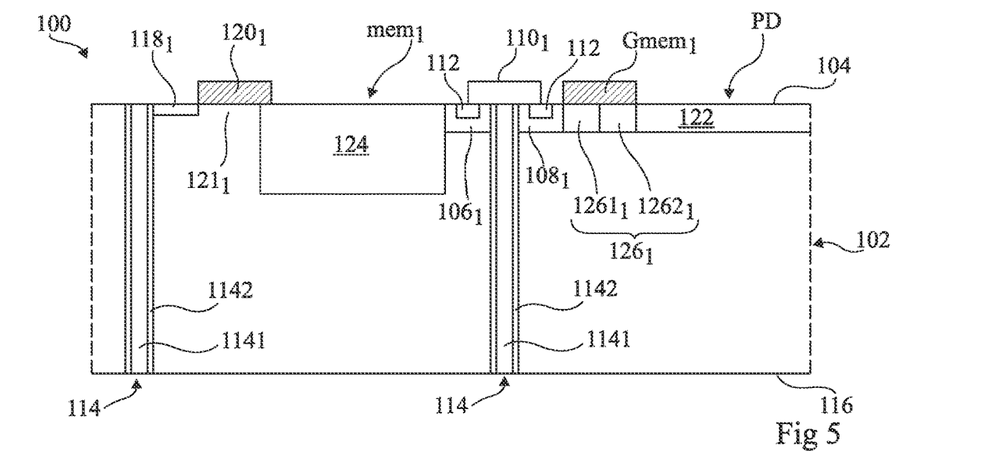
FIG. 5 is a schematic cross-sectional view along broken line AA in FIG. 4.

For each zone mem$_i$, the pixel 100 comprises an electrical connection 110$_i$ between the two doped zones 106$_i$ and 108$_i$ that are associated with the zone mem$_i$. The electrical connection 110$_i$ has an end in contact with the zone 106$_i$ and an end in contact with the zone 108$_i$. An electrical connection here refers to a connection made up of one or several conductive elements, preferably one or several metal conductive elements. More accurately, this electrical connection 110$_i$ is implemented outside the substrate 102, above its face 104, as shown in FIG. 5. The connection 110$_i$ for example, comprises two vias in contact with the respective zones 106$_i$ and 108$_i$, and a portion of a metal level of an interconnect structure (not shown) resting on the face 104 of the substrate 102, this metal level portion electrically connecting the two vias to one another.

In the example described here, the pixel 100 therefore comprises an electrical connection 110$_1$ between the doped zones 106$_1$ and 108$_1$, and an electrical connection 110$_2$ between the doped zones 106$_2$ and 108$_2$.

Preferably, as illustrated in FIG. 4, each zone 106$_i$ and each zone 108$_i$ comprises a contact resumption zone 112, more heavily doped with the same type as the zone 106$_i$ or 108$_i$ to which it belongs, the contact resumption zones therefore being doped with type n in this example. Each electrical connection 110$_i$ is then in contact, at each of its ends, with a zone 112.

The pixel 100 further comprises an insulated vertical electrode 114. The electrode 114 penetrates the substrate 102 from its face 104, the electrode 114 being substantially orthogonal to the face 104. The electrode 114 passes through the substrate 102, over its entire thickness. In other words, the electrode 114 extends from the face 104 of the substrate 102 to another face 116 of the substrate 102 (lower face in FIGS. 5 and 6), opposite the face 104. Although this has not been shown in FIG. 4 so as not to overload the figure, the electrode 114 comprises, as shown in FIG. 5, a conductive vertical wall, or conductive core, 1141, and an insulating core 1142 covering the wall 1141, and more accurately, all of the side partitions of the wall 1141, the wall 1141 thus being separated and electrically insulated from the substrate 102. The conductive wall 1141 is, for example, made from doped polycrystalline silicon. The layer 1142 is, for example, a layer of silicon oxide or a superposition of insulating layers, for example a superposition of a layer of silicon oxide, a layer of silicon nitride and a layer of silicon oxide forming an ONO (Oxide Nitride Oxide) structure.

During operation, a polarization potential is applied to the electrode 114. In this example where the photogenerated charges intended to be transferred to the zones mem$_i$ are the photogenerated electrons, this polarization potential is chosen so as to attract holes toward the partitions of the electrode 114. As an example, this polarization potential is equal to −2 V.

The electrode 114 physically separates the substrate 102 into several parts. In other words, the electrode 114 defines, in the substrate 102, several parts of the substrate 102 that are electrically and optically insulated from one another by the electrode 114. Two different parts of the substrate 102 are said to be electrically and optically insulated from one another, for example, if one of these two parts of the substrate 102 is completely surrounded by a portion of the electrode 114.

More specifically, the zones PD and $108_i$ belong to a first part of the substrate 102, and the zones $mem_i$ and $106_i$ belong to at least one second part of the substrate 102, electrically and optically insulated from the first part of the substrate 102. In other words, each zone $mem_i$ belongs to a second part of the substrate 102 that is electrically and optically insulated from the first part of the substrate 102 comprising the zone PD. For each zone $mem_i$, the zone $mem_i$ and the zone $106_i$ in contact with this zone $mem_i$ belong to the same second part of the substrate 102.

During operation, when light is received by the zone PD and charges are photogenerated and accumulated therein, as long as the gate $Gmem_1$ or $Gmem_2$ is not controlled in order to transfer these photogenerated charges from the zone PD to the zone $108_1$ or $108_2$, respectively, these charges cannot reach the zones $mem_1$ and $mem_2$, because of the electrical insulation implemented by the electrode 114 between the first part of the substrate 102 comprising the zone PD and the second part(s) of the substrate 102 comprising the zones $mem_1$ and $mem_2$.

Furthermore, when a ray of light reaches the first part of the substrate 102 comprising the zone PD, this ray of light is blocked by the electrode 114 and cannot propagate to a second part of the substrate 102 comprising the zone $mem_1$ and/or the zone $mem_2$, where this ray could have generated charges by photoconversion.

In the embodiment illustrated by FIGS. 4, 5, 6 and 7, each zone $mem_i$ belongs to a different second part of the substrate 102. In other words, in this example, the zone PD and the zones $108_1$ and $108_2$ belong to a first part of the substrate, the zones $mem_1$ and $106_1$ belong to a second part of the substrate 102, and the zones $mem_2$ and $106_2$ belong to another second part of the substrate 102. The second parts are electrically and optically insulated from the first part, in this example because each second part is completely surrounded by a corresponding portion of the electrode 114.

Each zone $mem_i$ of the pixel 100 has, in top view, or in other words, in a plane parallel to the faces 104 and 116, a rectangular shape. Each zone $mem_i$ is delimited laterally widthwise by two portions of the electrode 114, which are parallel and facing one another. For each storage zone $mem_i$, the zone $106_i$ that is associated with it is, for example, arranged at one end of the zone $mem_i$ considered lengthwise. Preferably, two zones $106_i$ and $108_i$ connected to one another by a connection $110_i$ that is to say two zones $106_i$ and $108_i$ that are associated with a same zone $mem_i$, are respectively arranged on each side of a same portion of the electrode 114, for example facing one another on each side of this portion of the electrode 114.

Preferably, as shown in FIG. 4, the zone PD is at least partially delimited laterally, that is to say in a plane parallel to the faces 104 and 116, by the electrode 114. In other words, the electrode 114 is arranged on, or constitutes, at least part of the contour of the zone PD. In the example of FIG. 4, the zone PD has, in top view, a substantially square shape. As shown in FIG. 4, the electrode 114 is then, for example, arranged on three sides of the zone PD. As shown in FIG. 4, the zones $108_i$ are then preferably arranged in corners of the zone PD.

In the illustrated example, the zone $mem_1$ is arranged along a first side of the zone PD, and the zone $mem_2$ is arranged along a second side of the zone PD. Providing a zone $mem_i$ arranged along one side of the zone PD makes it possible for a portion of the electrode 114, laterally delimiting the zone $mem_i$ widthwise, also to delimit the side of the zone PD bordered by this zone $mem_i$. This allows the pixel 100 to be particularly compact.

In the present embodiment, the zones $mem_i$ are pinned charge storage zones, or memory zones, and the zone PD is a pinned photodiode. There is therefore, in each of the zones $mem_i$ and PD, a potential well in which charges can be stored or accumulated. The depth of the well of a zone $mem_i$ or PD in particular depends on the polarization applied to the part of the substrate 102 that comprises this zone $mem_i$ or PD.

According to one embodiment, during operation, a first polarization potential is applied to the first part of the substrate 102 that comprises the zone PD. Furthermore, for each storage zone $mem_i$, the first polarization potential is applied to the second part of the substrate 102 that comprises the zone $mem_i$, during each reading phase of the zone $mem_i$, and, more accurately, during the entire duration of each reading phase of this zone $mem_i$. Outside of reading phases of the zone $mem_i$, a second polarization potential is applied to the second part of the substrate 102 comprising the zone $mem_i$.

The first and second polarization potential are chosen such that the potential well in a zone $mem_i$ is deeper when the second part of the substrate 102 that comprises this zone $mem_i$ is polarized with the second potential than when it is polarized with the first potential. Thus, when the zone $mem_i$ is not in the process of being read, a larger number of charges can be stored in the zone $mem_i$.

As an example, in the case of a p-doped substrate 102, the first potential is for example the ground potential, the second potential then being greater than the first potential, for example substantially equal to 1 V.

Providing two polarization potentials for the second part(s) of the substrate 102 comprising the zones $mem_i$ is made possible because this or these second part(s) are electrically insulated from the first part of the substrate comprising the zone PD by the electrode 114.

As an example, the first and second polarization potentials are provided by a control circuit of the pixel 100, for example by a control circuit of the pixels by a sensor comprising several pixels 100, for example a sensor similar to that described in relation with FIG. 1.

The pixel 100 further comprises, for each zone $mem_i$, a doped reading zone $118_i$ arranged in the substrate 102, on the side of its face 104. In other words, the zone $118_i$ penetrates the substrate 102 from its face 104. The zone $118_i$ is said to be associated with this zone $mem_i$. The zone $118_i$ is doped with the same type of conductivity as the zones $106_i$ and $108_i$, that is to say type n in this example.

For each zone $mem_i$, the pixel 100 also comprises a gate $120_i$ resting on a portion $121_i$ of the substrate 102 extending between the zone $mem_i$ and the reading zone $118_i$ associated with this zone $mem_i$. In other words, the region $121_i$ extends from the zone $mem_i$ to the zone $118_i$ that is covered, preferably completely, by the gate $120_i$. The gate $120i$ is said to be associated with this zone $mem_i$. The gate $120_i$ corresponds to the gate of the transistor $Tsn_i$ described in relation with FIG. 2, the reading zone $120_i$ and the zone $mem_i$ associated with this gate $120_i$ forming the source and the drain of the transistor $Tsn_i$, and the portion $121_i$ of the substrate forming the channel region of this transistor $Tsn_i$.

In the example described here, the pixel 100 therefore comprises a zone $118_1$ and a gate $120_1$ that are associated with the zone $mem_1$, as well as a zone $118_2$ and a gate $120_2$ that are associated with the zone $mem_2$.

Each gate $120_i$ belongs to the same second part of the substrate 102 as the zone $mem_i$ with which it is associated.

As shown in FIGS. 4 and 5, the reading zone $118_i$ associated with a zone $mem_i$ is, for example, arranged on the side of one end of the zone $mem_i$, considered lengthwise, opposite the end of the zone $mem_i$ in contact with the zone $106_i$ associated with this zone $mem_i$.

Preferably, each gate $120_i$ spreads over the charge storage area $mem_i$ with which it is associated, which facilitates the transfer of charges from the zone $mem_i$ toward the corresponding zone $118_i$.

The implementation of the zones $mem_i$ and PD previously described will now be described in more detail.

Figure 6:
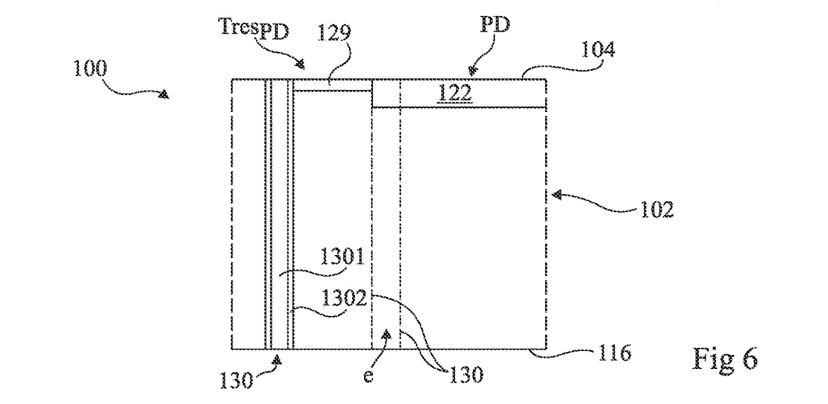
FIG. 6 is a schematic sectional view along plane BB in FIG. 4.
Figure 7:
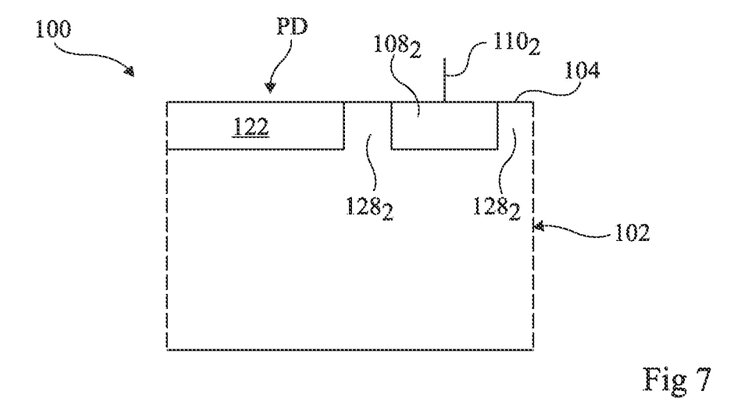
FIG. 7 is a schematic sectional view along plane CC in FIG. 4.

As illustrated in FIGS. 5, 6 and 7, the zone PD comprises a layer 122 doped with the same type of conductivity as the zones $106_i$, $108_i$ and $118_i$, that is to say type n in this example. Preferably, the level of doping of the layer 122 is less than or equal to, for example equal to, that of the zones $106_i$ and $108_i$.

The layer 122 is arranged in the substrate 102, on the side of its face 104. In other words, the layer 122 penetrates the substrate 102 from its face 104.

Although this is not visible in the figures, in top view, the layer 122 extends laterally over the entire surface of the zone PD, to the portions of the electrode 114 delimiting the zone PD.

Furthermore, although this is not shown in FIGS. 4 to 7, preferably, the layer 122 is covered, on the side of the face 104, with a doped layer of the same type as the substrate 102, type p in this example, this layer further being more heavily doped than the substrate 102. This highly p-doped layer has a face combined with the face 104. Preferably, on the side of the face 104, the layer 122 is completely covered by this highly p-doped layer.

When, in a direction orthogonal to the face 104, the doping level of the substrate 102 decreases approaching the surface 104, and more accurately, approaching the layer 122, the photogenerated charges intended to be transferred toward the zone $mem_i$, that is to say the photogenerated electrons in this example, are more easily drained to the layer 122, where they can accumulate before being transferred toward a zone $mem_i$.

Each zone $mem_i$ comprises a box 124 doped with the same type of conductivity as the layer 122, that is to say type n in this example, arranged in the substrate 102, on the side of the face 104. In other words, the box 124 penetrates the substrate 102 from its upper face 104. Preferably, the level of doping of each box 124 is greater than that of the zones $106_i$ and $108_i$.

Although this is not visible in the figures, in top view, the box 124 of each zone $mem_i$ extends over the entire surface of the zone $mem_i$. The box 124 therefore extends from one to the other of the parallel portions of the electrode 114 that laterally delimit the zone $mem_i$ widthwise.

Furthermore, although this is not shown in FIGS. 4 to 7, each box is covered, on the side of the face 104, with a doped layer of the same type as the substrate 102, type p in this example, this layer further being more heavily doped than the substrate 102. This highly p-doped layer has a face combined with the face 104. Preferably, on the side of the face 104, each box 124 is completely covered by this highly p-doped layer, with the exception of any portion of the box 124 that is covered by the corresponding gate $120_i$. Preferably, this highly p-doped layer has the same level of doping as the highly p-doped layer that covers the layer 122, for example, because these layers were made simultaneously.

During operation, when the electrode 114 is polarized and charges, in this example holes, accumulate along the electrode 114, this causes a passivation of the interface between the insulating layer 1142 of the electrode 114 on the one hand and the boxes 124 and the n-doped layer 122 on the other hand. This passivation prevents photogenerated charges, and more specifically photogenerated electrons in this example, from being trapped at this interface. Furthermore, this accumulation of holes along the electrode 114 forms a conductive layer that is then at the same potential as the substrate 102 and that laterally borders the boxes 124 and the layer 122.

According to one embodiment, as shown in FIG. 5, each portion $126_i$ of the substrate 102 covered with a gate $Gmem_i$ and extending between the zone PD and a corresponding zone $108_i$ is doped with the same type of conductivity as the layer 120 and the zone $106_i$, that is to say type n in this example. This makes it possible, during a transfer of charges from the zone PD toward a zone $mem_i$, to reduce, or even cancel out, the number of charges remaining trapped at the interface between the substrate 102 and the insulator of the gate $Gmem_i$.

Furthermore, in such an embodiment, this channel region $126_i$ is preferably not as strongly doped as the layer 120 and the region $108_i$ between which they extend. Thus, outside a transfer of charges, via the region $126_i$, from the zone PD to the corresponding zone $mem_i$, the channel region $126_i$ forms a potential barrier for the charges.

According to one embodiment, as illustrated in FIG. 5, for each zone $mem_i$, when the region $126_i$ is doped with the type of conductivity opposite that of the substrate 102, that is to say type n in this example, the region $126_i$ comprises a first portion $1261_i$ and a second portion $1262_i$ doped with the type of conductivity opposite that of the substrate 102, that is to say type n in this example. The second portion $1262_i$ is less heavily doped than the first portion $1261_i$. The portion $1262_i$ extends from the layer 122 to the portion $1261_i$, and the portion $1261_i$ extends from the portion $1262_i$ to the corresponding zone $108_i$. The portion $1262_i$ then forms, between the portion $1261_i$ and the layer 122, a potential barrier that prevents the charges present in the portion $1261_i$ from returning toward the layer 122. This is particularly advantageous at the end of a transfer of charges from the zone PD toward a zone $mem_i$, when the potential applied on the corresponding gate $Gmem_i$ is switched from a first value for which the region $126_i$ forms a potential well between the zone $108_i$ and the layer 122, to a second value for which the region $126_i$ forms a potential barrier between the zone $108_i$ and the layer 122.

For each zone $mem_i$, there is no portion of the layer 122 in direct contact with the zone $108_i$ associated with this zone $mem_i$, as shown in particular in FIGS. 4, 5 and 7. The zone $108_i$ is, for example, separated from the layer 122, not only by the channel region $126_i$ covered by the corresponding gate $Gmem_i$ but also by a region $128_i$ of the substrate 102, arranged on either side of the gate $Gmem_i$.

According to one embodiment, as described in relation with FIG. 2, and as shown in FIGS. 4 and 6, the pixel 100 comprises a transistor $Tres_{PD}$.

In this example, the transistor $Tres_{PD}$ is called "vertical gate" transistor. In other words, the transistor $Tres_{PD}$ comprises a doped region 129 of the same type as the layer 122, that is to say type n in this example, the region 129 being more heavily doped than the layer 122 and being surrounded by an insulated vertical electrode 130, or vertical gate 130, passing through the substrate 102. The vertical gate 130 comprises a conductive wall 1301 and an insulating layer 1302 separating and insulating the wall 1301 from the substrate 102. Preferably, the wall 1301 and the layer 1302 are identical, respectively, to the wall 1141 and the layer 1142 of the electrode 114. A space e is arranged between two ends of the electrode 130, facing one another (in dotted lines in FIG. 6). The layer 122 extends, in this space e, up to the region 129. During operation, a supply potential is applied to the region 129. Furthermore, depending on the potential level of a control signal ($Vres_{PD}$ in FIG. 2) applied to the gate 130, either a potential barrier forms in the space e and prevents the passage of the photogenerated charges toward the region 129 (transistor $Tres_{PD}$ off), or the potential barrier is missing and the charges photogenerated in the layer 122 are discharged from the zone PD toward the potential applied to the region 129 (transistor $Tres_{PD}$ on).

Figure 8:
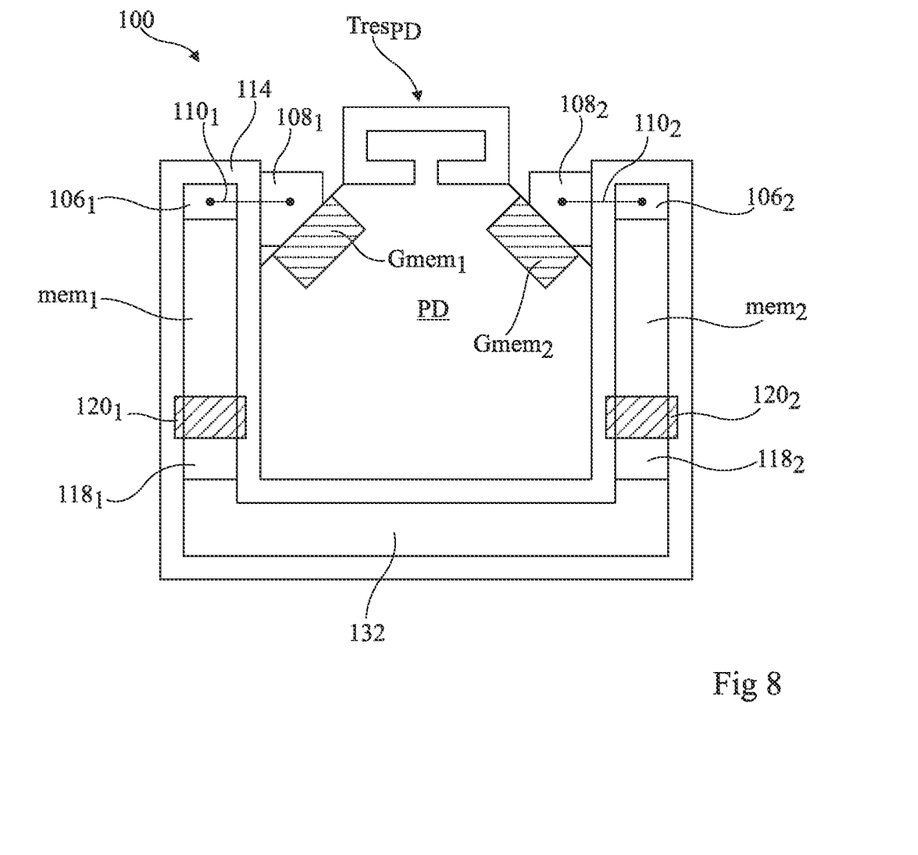
FIG. 8 shows, in schematic top view, a variant embodiment of the pixel of FIGS. 4, 5, 6 and 7.

FIG. 8 shows, in schematic top view, a variant embodiment of the pixel 100 of FIGS. 4, 5, 6 and 7.

In this variant, several zones $mem_i$ belong to a same second part of the substrate 102 that is optically and electrically insulated from the first part of the substrate 102 comprising the zone PD. Only the differences between the pixel 100 of FIGS. 4, 5, 6 and 7 and the pixel 100 of FIG. 8 are highlighted.

Preferably, as illustrated in FIG. 8, this second part of the substrate 102 shared by several zones $mem_i$ comprises a portion 132 that is not occupied by these zones $mem_i$, the zones $106_i$ and $118_i$ associated with these zones $mem_i$, and the corresponding gates $120_i$. Thus, transistors (not shown), for example the transistors Tres, Tsuiv and Tsel described in relation with FIG. 2, can be formed in this portion 132.

More particularly, in this example, the zone $mem_1$ belongs to the same second part of the substrate 102 as the zone $mem_2$. Preferably, this second part of the substrate 102 comprises a portion 132 as described above. For example, the zone $mem_1$ is arranged along a first side of the zone PD, the zone $mem_2$ is arranged along a second side of the zone PD opposite the first side and the portion 132 is arranged along a third side of the zone PD. Thus, the portion of the electrode that delimits the region 132 of the side of the zone PD also delimits the third side of the zone PD. This allows the pixel 100 to be particularly compact.

Figure 9:
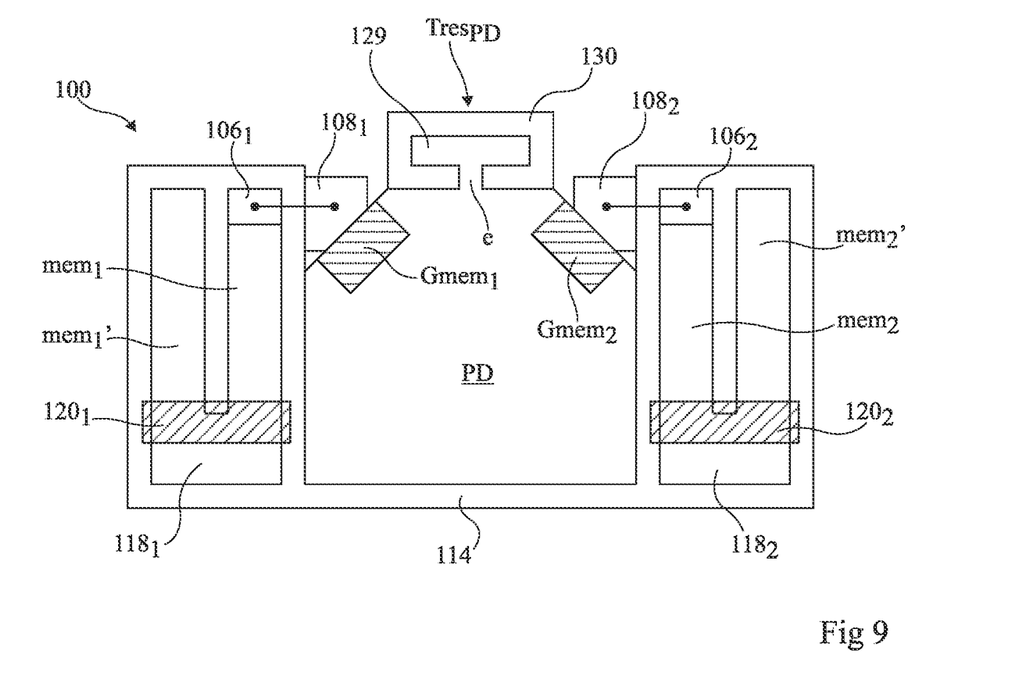
FIG. 9 shows, in schematic top view, of another variant embodiment of the pixel of FIGS. 4, 5, 6 and 7.

FIG. 9 shows, in schematic top view, another variant embodiment of the pixel 100 of FIGS. 4, 5, 6 and 7. Only the differences between the pixel 100 of FIGS. 4, 5, 6 and 7 and the pixel 100 of FIG. 9 are highlighted.

In this variant, for each zone $mem_i$, the pixel 100 comprises an additional charge storage zone $mem_i'$ identical to the zone $mem_i$ and formed in the same second part of the substrate 102 as the zone $mem_i$, the zone $mem_i'$ being said to be associated with the zone $mem_i$.

Unlike the zone $mem_i$, the zone $mem_i'$ is not in contact with the zone 106. Conversely, the zone $mem_i'$ shares the same gate $120_i$ and the same reading zone $118_i$ as the zone $mem_i$. Furthermore, the doped box 124 (FIG. 5) of the zone $mem_i$ comprises an extension (not shown) to the doped box (not shown) of the zone $mem_i'$. This extension is covered by the gate $120_i$. Thus, when potential applied to the gate $120_i$ is such that the transistor $Tsn_i$ (FIG. 2) is in the off state, if the number of photogenerated charges that have been transferred to the zone $mem_i$ becomes too high, the excess charges spread into the zone $mem_i'$ where they can be stored before being read at the same time as the charges stored in the zone $mem_i$.

Preferably, as shown in FIG. 9, each zone $mem_i'$ is arranged along the zone $mem_i$ with which it is associated, such that one of the two portions of the electrode 114 that delimits the zone $mem_i$ laterally and widthwise is also one of the two portions of the electrode 114 that delimits the zone $mem_i'$ laterally and widthwise.

Figure 10:
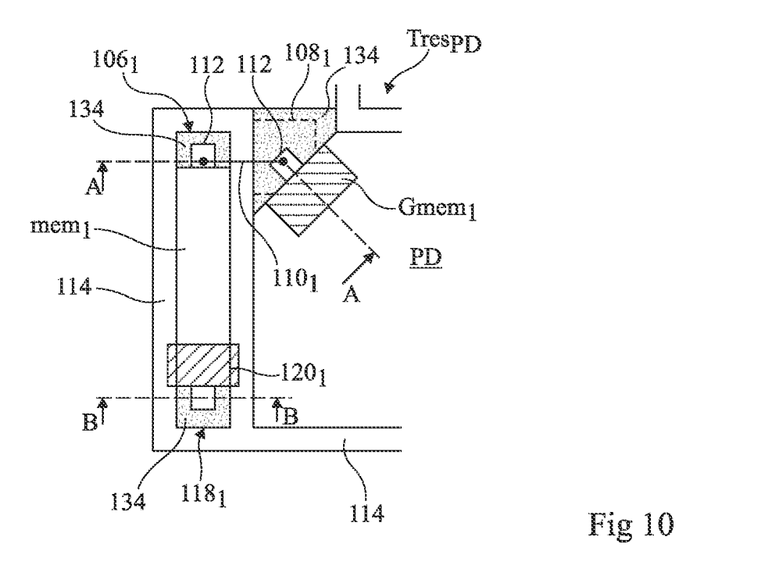
FIG. 10 shows, in schematic top view, part of the pixel of FIGS. 4, 5, 6 and 7 according to a variant embodiment.
Figure 11:
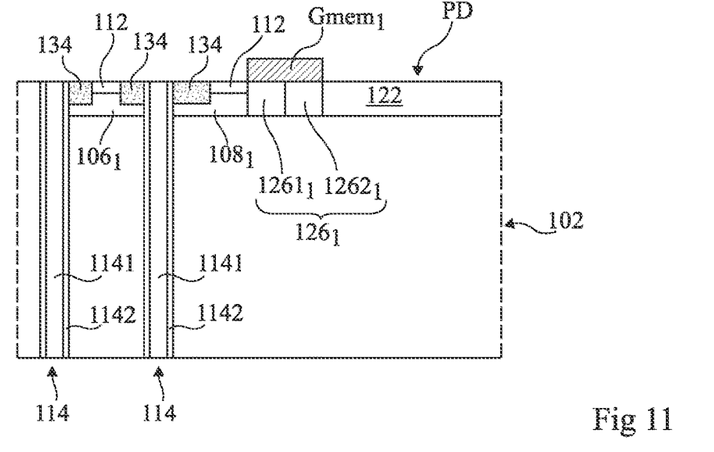
FIG. 11 is a schematic cross-sectional view along broken line AA in FIG. 10.
Figure 12:
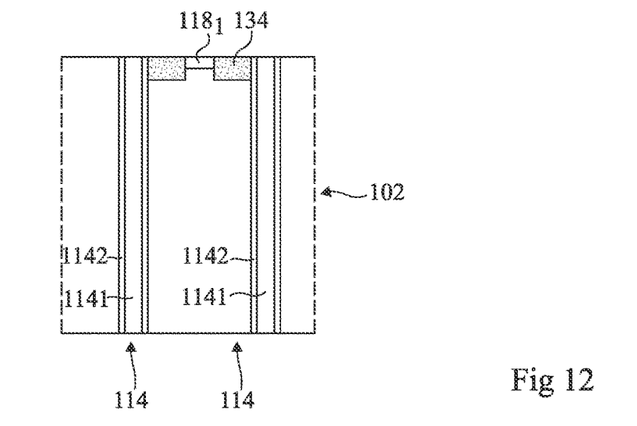
FIG. 12 is a schematic cross-sectional view of another example of part of the pixel of FIG. 10.

FIG. 10 shows, in schematic top view, part of the pixel 100 of FIGS. 4, 5, 6 and 7 according to a variant embodiment. FIG. 11 is a schematic cross-sectional view along broken line AA in FIG. 10. FIG. 12 is a schematic cross-sectional view of another example of part of the pixel of FIG. 10. Only the differences between the pixel 100 of FIGS. 4, 5, 6 and 7 and the pixel 100 of FIGS. 10, 11 and 12 are highlighted.

FIGS. 10, 11 and 12, and more particularly FIG. 10, show part of the zone PD, part of the transistor $Tres_{PD}$, part of the electrode 114, a zone $mem_i$, the zones $106_i$, $108_i$ and $118_i$ associated with this zone $mem_i$, and the gates $Gmem_i$ and $120_i$ associated with this zone $mem_i$. The zone $mem_1$ is shown in this example, with the understanding that what is described here for the zone $mem_1$ applies to all of the zones $mem_i$.

In this variant, the zones $106_1$ and $108_1$ each comprise a contact resumption zone 112.

The region 112 of the zone $108_1$ is separated from the portion of the electrode 114 with which the zone $108_1$ is in contact by an insulating trench 134. This makes it possible to limit the capacitive couplings between the electrode 114 and the region 112. As an example, the trench 134 penetrates the substrate 102 from its face 104, less deeply than the zone $108_i$. Preferably, the region 112 of the zone $108_1$ has, on one of its sides, one side overhanging the gate $Gmem_1$, and is bordered by the trench 134 on all of its other sides.

Similarly, the region 112 of the zone $106_1$ can also be separated from the portion of the electrode 114 with which the zone $106_1$ is in contact by an insulating trench 134. As an example, the trench 134 penetrates the substrate 102 from its face 104, less deeply than the zone $106_i$. Preferably, the region 112 of the zone $106_1$ has one side in contact with the zone $mem_1$, and is surrounded by the trench 134 on all of its other sides.

As shown in FIGS. 10 and 12, preferably, the zone $118_1$ is also separated from the portions of the electrode 114 that surround it by an insulating trench 134. Preferably, the trench 134 completely surrounds the zone $118_1$, except on the side of the zone $118_1$ aligned with one side of the corresponding gate $120_1$.

The variant embodiment of FIGS. 10, 11 and 12 is compatible with the variant of FIG. 8 and/or with the variant of FIG. 9. Furthermore, the variants 8 and 9 can be combined.

When the pixel 100 described above is part of the matrix of pixels 100 of a sensor, for example a TOF sensor of the type described in relation with FIG. 1, adjacent pixels can share common elements, in particular a first or a second part of the substrate 102.

As an example: a zone $mem_i$ of a pixel 100 can belong to a same second part of the substrate 102 as a zone $mem_i$ of an adjacent pixel 100 or, in other words, two adjacent pixels 100 can share a same second part of the substrate 102; and/or two adjacent pixels 100 can share a same electrode 114; and/or the zone PD of a pixel 100 can belong to the same first part of the substrate 102 as the zone PD of an adjacent pixel 100, or, in other words, two adjacent pixels 100 can share a same first part of the substrate 102; and/or a zone $mem_i$ of a pixel 100 and a zone $mem_j$ of an adjacent pixel 100 can be associated with a same reading zone $118_i$; and/or all of the zones $mem_i$ of a pixel 100 can belong to a second part of the substrate 102 to which all of the zones $mem_i$ of an adjacent pixel 100 also belong, this second part of the substrate being able to comprise a region 132 shared by the two adjacent pixels 100.

One specific example of an association of several pixels 100 comprising common elements, or in other words, elements shared by several adjacent pixels 100, will now be described.

Figure 13:
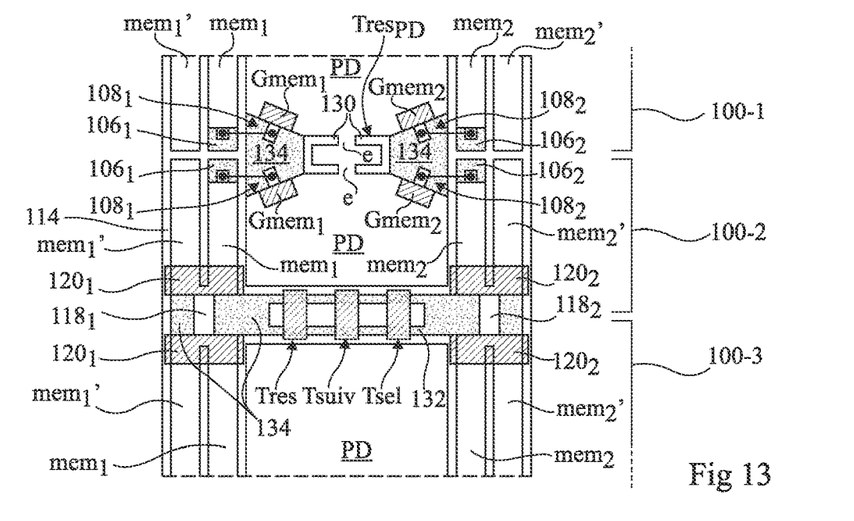
FIG. 13 shows, in schematic top view, an embodiment of a combination of several pixels of the type previously described in relation with FIGS. 4 to 12.

FIG. 13 shows, in schematic top view, an embodiment of a combination of several adjacent pixels 100 of a sensor comprising a matrix of pixels 100, for example the sensor 1.

More specifically, FIG. 13 shows three pixels 100, hereinafter respectively referenced 100-1, 100-2 and 100-3, of a same row or of a same column of a matrix of pixels 100, preferably of a same column of the matrix. The pixel 100-2 is, for example, arranged between the pixels 100-1 and 100-3, each of the pixels 100-1 and 100-3 being adjacent to the pixel 100-2. In FIG. 13, the pixel 100-1, partially shown, is arranged at the top of the figure, the pixel 100-2, completely shown, is arranged at the center of the figure, and the pixel 100-3, partially shown, is arranged at the bottom of the figure.

In this exemplary embodiment, as described in relation with FIG. 8, each pixel 100-1, 100-2, 100-3 has two zones $mem_1$ and $mem_2$ belonging to a same second part of the substrate 102, this second part of the substrate 102 comprising a region 132. Furthermore, as described in relation with FIG. 9, each zone $mem_i$ of each pixel 100-1, 100-2, 100-3 is associated with an additional zone $mem_i'$. Lastly, as described in relation with FIGS. 10, 11 and 12, insulating trenches 134 are provided for each zone $108_i$, each zone $106_i$ and each zone $118_i$.

In this embodiment, all of the pixels 100-1, 100-2 and 100-3 share a same electrode 114. Indeed, although FIG. 13 appears to show several separate electrodes 114, the latter in fact correspond to portions of a same electrode 114. Preferably, although this is not visible in FIG. 13, all of the pixels 100 of a matrix of pixels 100 of a sensor share the same electrode 114.

In this embodiment, the zone PD of the pixel 100-2 belongs to the same first part of the substrate 102 as the zone PD of the pixel 100-1. Conversely, the zone PD of the pixel 100-3 belongs to another first part of the substrate 102.

Preferably, as shown in FIG. 13, the two pixels 100-1 and 100-2 that share a same first part of the substrate 102 share the same transistor $Tres_{PD}$. In this example where the transistor $Tres_{PD}$ is a vertical gate transistor, the electrode 130 then comprises two separate portions. A space e is arranged, on the side of the zone PD of the pixel 100-1, between a first end of a first portion of the electrode 130 and a first end of a second portion of the electrode 130, and another space e is arranged, on the side of the zone PD of the pixel 100-2, between a second end of the first portion of the electrode 130 and a second end of the second portion of the electrode 130.

Furthermore, since the pixels 100-1 and 100-2 share a same first part of the substrate 102, although the pixel 100-1 does not share its zones $108i$ with the pixel 100-2, the trench 134 of a zone $108_i$ of the pixel 100-1 is preferably the same trench 134 as that of the corresponding zone $108_i$ of the pixel 100-2.

In this embodiment, the zones $mem_i$ and $mem_i'$ of the pixel 100-2 belong to the same second part of the substrate 102 as the zones $mem_i$ and $mem_i'$ of the pixel 100-3. Conversely, the zones $mem_i'$ and $mem_i'$ of the pixel 100-1 belong to another second part of the substrate 102.

Since the pixels 100-2 and 100-3 share a same second part of the substrate 102, the zone 132 that it comprises is shared by these two pixels 100-2 and 100-3, as shown in FIG. 13. Thus, the transistors that are formed in this common region 132, in this example the transistors Tres, Tsuiv and Tsel described in relation with FIG. 2, are shared by the two pixels 100-2 and 100-3.

Furthermore, since the pixels 100-2 and 100-3 share a same second part of the substrate 102, two zones $mem_i$ and $mem_i'$ of the pixel 100-2 can be associated with the same zone $118_i$ as that with which two corresponding zones $mem_i$ and $mem_i'$ of the pixel 100-3 are associated. In other words, in this example, the pixels 100-2 and 100-3 share a same zone $118_1$ and share a same zone $118_2$. As an example, as shown in FIG. 13, two zones $mem_i$ and $mem_i'$ of the pixel 100-2 each have an end arranged facing a same first side of the corresponding zone $118_i$, and the two corresponding zones $mem_i$ and $mem_i'$ of the pixel 100-3 each have one end arranged facing a same second side of this zone $118_i$, this second side being opposite the first side.

As an example, the association of the three pixels 100-1, 100-2 and 100-3 described above can be repeated in a first direction in which the pixels 100-1, 100-2 and 100-3 follow one another, that is to say vertically in FIG. 13, for example to form a column of pixels 100. This column of pixels is for example repeated in a second direction orthogonal to the first in order to form a matrix of pixels.

When the association of the three pixels 100-1, 100-2 and 100-3 described above is also repeated in the second direction (horizontally in FIG. 13), each zone $mem_i'$ of a pixel 100 is then preferably delimited laterally widthwise by a portion of the electrode 114 that also delimits a corresponding zone $mem_i'$ of an adjacent pixel 100.

The embodiment described in relation with FIG. 13 makes it possible to obtain a particularly compact matrix of pixels 100.

Embodiments and variant embodiments have been described above, in relation to FIGS. 4 to 13, of a pixel 100 in the case where, as an example, the pixel 100 comprises two storage zones $mem_i$. Those skilled in the art are able to adapt the description of this example to the case of a pixel 100 comprising only one zone $mem_i$ or, on the contrary, more than two zones $mem_i$. As an example, a pixel 100 comprising only one zone $mem_i$ is used as pixel of a global shutter image sensor. As an example, a pixel 100 comprising three zones $mem_i$ can be used in a TOF sensor, similarly to what was previously described.

Various embodiments and variants have been described. Those skilled in the art will understand that certain features of these embodiments can be combined and other variants will readily occur to those skilled in the art. In particular, the pixel 100 has been described in the case where, as an example, the photogenerated charges that are intended to be transferred to the zones $mem_i$ are photogenerated electrons. Those skilled in the art are able to adapt the disclosure to the case where these charges are photogenerated holes, in particular by reversing all of the conductivity types indicated as an example and by adapting the control and polarization potential levels.

Finally, the practical implementation of the embodiments and variants described herein is within the capabilities of those skilled in the art based on the functional description provided hereinabove. In particular, those skilled in the art are capable of choosing the high and low levels of the control signals applied to the gates Gmem$_i$, 130 and 120$_i$ and/or the polarization potential level(s) applied to the substrate 102 and/or the level of the polarization potential applied to the electrode 114 and/or the doping levels of the various layers, zones and boxes described, for example using a simulation tool implemented by computer.

The invention claimed is:

1. A pixel comprising:
 a photoconversion zone;
 an insulated vertical electrode; and
 at least one charge storage zone;
 wherein the photoconversion zone belongs to a first part of a semiconductor substrate;
 wherein each charge storage zone belongs to a second part of the semiconductor substrate that is physically separated from the first part of the semiconductor substrate by the insulated vertical electrode;
 wherein the insulated vertical electrode passes through the semiconductor substrate from a first face of the semiconductor substrate; and
 for each charge storage zone:
  a first doped zone in contact with said charge storage zone in the second part;
  a second doped zone in the first part;
  a gate resting on the first face of the semiconductor substrate between the photoconversion zone and said second doped zone; and
  an electrical connection between the first doped zone and the second doped zone;
 wherein the insulated vertical electrode is configured, for each charge storage zone, to electrically and optically insulate the first part of the semiconductor substrate comprising the photoconversion zone and the second doped zone from the second part of the semiconductor substrate comprising the charge storage zone and the first doped zone.

2. The pixel according to claim 1, wherein, for each charge storage zone, said electrical connection is arranged outside the semiconductor substrate, above the first face of the semiconductor substrate.

3. The pixel according to claim 1, wherein, each charge storage zone is delimited laterally, widthwise, by two portions of the insulated vertical electrode that are parallel and facing one another, the first doped zone in contact with the charge storage zone being arranged at one end of the charge storage zone taken lengthwise.

4. The pixel according to claim 1, wherein:
 the semiconductor substrate is doped with a first type of conductivity;
 the photoconversion zone comprises a layer doped with a second type of conductivity, arranged in the semiconductor substrate on the first face of the semiconductor substrate;
 for each charge storage zone, the first and second doped zones are arranged in the semiconductor substrate, on the first face of the semiconductor substrate, and are doped with the second type of conductivity; and
 each charge storage zone comprises a region doped with the second type of conductivity, arranged in the semiconductor substrate, on the first face of the semiconductor substrate.

5. The pixel according to claim 4, wherein, for each charge storage zone, the first and second doped zones have a same doping level.

6. The pixel according to claim 4, wherein, for each charge storage zone, the first and second doped zones have a same doping level as the layer of the photoconversion zone.

7. The pixel according to claim 4, wherein, for each charge storage zone, the region of the charge storage zone is more greatly doped than the first doped zone.

8. The pixel according to claim 4, wherein, for each charge storage zone, said gate rests on a channel region extending from the second doped zone to the layer of the photoconversion zone, the channel region being less heavily doped with the second type of conductivity than the layer of the photoconversion zone and the second doped zone.

9. The pixel according to claim 8, wherein, for each charge storage zone, the channel region comprises a first portion and a second portion less heavily doped than the first portion, the second portion extending from the layer of the photoconversion zone to the first portion and the first portion extending from the second portion to the second doped zone.

10. The pixel according to claim 8, wherein, for each charge storage zone, the second doped zone is separated from the layer of the photoconversion zone by the channel region and by a region of the semiconductor substrate doped with the first type of conductivity.

11. The pixel according to claim 1, wherein, for each charge storage zone, the pixel comprises:
 a doped reading zone arranged in the semiconductor substrate on the side of the first face in the second part of the semiconductor substrate with the charge storage zone; and
 an additional gate resting on a portion of the semiconductor substrate extending between the charge storage zone and the reading zone, the additional gate spreading to the charge storage zone.

12. The pixel according to claim 1, wherein at least two charge storage zones belong to a same second part of the semiconductor substrate.

13. A pixel comprising:
 a photoconversion zone;
 an insulated vertical electrode; and
 at least one charge storage zone;
 wherein the photoconversion zone belongs to a first part of a semiconductor substrate;
 wherein each charge storage zone belongs to a second part of the semiconductor substrate that is physically separated from the first part of the semiconductor substrate by the insulated vertical electrode; and
 a circuit configured:
  to apply a first polarization potential to the first part of the semiconductor substrate; and
  for each charge storage zone:
   to apply the first polarization potential to the second part of the semiconductor substrate during each reading phase of the charge storage zone; and
   to apply a second polarization potential to the second part of the semiconductor substrate outside of reading phases of said charge storage zone;
  wherein the first and second polarization potentials are configured so that a potential well in the charge storage zone is deeper when the second polarization potential is applied than when the first polarization potential is applied.

14. The pixel according to claim 13, wherein at least two charge storage zones belong to a same second part of the semiconductor substrate.

15. A sensor, comprising a plurality of pixels, wherein each pixel comprises:

a photoconversion zone;
an insulated vertical electrode; and
at least one charge storage zone;
wherein the photoconversion zone belongs to a first part of a semiconductor substrate; and
wherein each charge storage zone belongs to a second part of the semiconductor substrate that is physically separated from the first part of the semiconductor substrate by the insulated vertical electrode; and
wherein two adjacent pixels share same first part of the semiconductor substrate.

16. The sensor according to claim 15, wherein two adjacent pixels share a same second part of the semiconductor substrate.

17. The sensor according to claim 15, further comprising a circuit configured:
to apply a first polarization potential to the first part of the semiconductor substrate; and
for each charge storage zone:
to apply the first polarization potential to the second part of the semiconductor substrate comprising the storage zone during each reading phase of the charge storage zone; and
to apply a second polarization potential to the second part outside of reading phases of said charge storage zone;
wherein the first and second polarization potentials are configured so that a potential well in the charge storage zone is deeper when the second polarization potential is applied to the second part of the semiconductor substrate than when the first polarization potential is applied to the second part of the semiconductor substrate.

18. A control method for a pixel that includes a photoconversion zone, an insulated vertical electrode, and at least one charge storage zone, wherein the photoconversion zone belongs to a first part of a semiconductor substrate, and wherein each charge storage zone belongs to a second part of the semiconductor substrate that is physically separated from the first part of the semiconductor substrate by the insulated vertical electrode, comprising:
polarizing the first part of the semiconductor substrate with a first polarization potential; and
for each charge storage zone:
polarizing the second part of the semiconductor substrate with the first polarization potential during each reading phase of the charge storage zone; and
polarizing said second part outside of reading phases of said charge storage zone with a second polarization potential;
wherein the first and second polarization potentials are configured so that a potential well in the charge storage zone is deeper when the second polarization potential is applied to the second part of the semiconductor substrate than when the first polarization potential is applied to the second part of the semiconductor substrate.

19. A pixel comprising:
a semiconductor substrate;
a photoconversion zone in a first part of a semiconductor substrate;
a charge storage zone in a second part of the semiconductor substrate;
an insulated vertical electrode extending completely through the semiconductor substrate and positioned to electrically and optically insulate the charge storage zone from the photoconversion zone;
a first doped zone in the second part of the semiconductor substrate in contact with said charge storage zone;
a second doped zone in the first part of the semiconductor substrate;
a gate structure over the semiconductor substrate and positioned between the photoconversion zone and said second doped zone; and
an electrical connection between the first doped zone and the second doped zone.

20. The pixel according to claim 19, wherein said electrical connection is arranged above the semiconductor substrate and extends over the insulated vertical electrode.

21. The pixel according to claim 19, wherein two portions of the insulated vertical electrode extending parallel to and facing one another delimit the charge storage zone in width, and wherein two other portions of the insulated vertical electrode extending parallel to and facing one another delimit the charge storage zone in length.

22. The pixel according to claim 19, further comprising:
a doped reading zone in the second part of the semiconductor substrate; and
an additional gate structure resting on a portion of the semiconductor substrate in the second part extending over the semiconductor substrate and positioned between the charge storage zone and the doped reading zone.

23. The pixel according to claim 19, wherein:
the semiconductor substrate is doped with a first type of conductivity;
the photoconversion zone comprises a layer doped with a second type of conductivity; and
the charge storage zone is doped with the second type of conductivity.

24. The pixel according to claim 23, wherein the second doped zone is separated from the layer of the photoconversion zone by a channel region over which said gate structure extends.

25. The pixel according to claim 24, wherein the channel region comprises:
a first doped portion in contact with the second doped zone; and
a second doped portion in contact with the photoconversion zone.

26. A pixel comprising:
a semiconductor substrate;
a photoconversion zone in a first part of a semiconductor substrate;
a charge storage zone in a second part of the semiconductor substrate;
an insulated vertical electrode extending completely through the semiconductor substrate and positioned to electrically and optically insulate the charge storage zone from the photoconversion zone; and
a circuit configured:
to apply a first polarization potential to the first part of the semiconductor substrate;
to apply the first polarization potential to the second part of the semiconductor substrate during each reading phase of the charge storage zone; and
to apply a second polarization potential, different from the first polarization potential, to the second part of the semiconductor substrate outside of reading phases of said charge storage zone.

* * * * *